United States Patent

Luo

[11] Patent Number: 5,981,967
[45] Date of Patent: Nov. 9, 1999

[54] METHOD AND APPARATUS FOR ISOLATING DEFECTS IN AN INTEGRATED CIRCUIT NEAR FIELD SCANNING PHOTON EMISSION MICROSCOPY

[75] Inventor: Zhouxing Luo, Sugar Land, Tex.

[73] Assignee: Texas Instruments Incorporated, Dallas, Tex.

[21] Appl. No.: 08/992,707

[22] Filed: Dec. 17, 1997

Related U.S. Application Data

[60] Provisional application No. 60/033,101, Dec. 17, 1996.

[51] Int. Cl.[6] ...................................................... G01N 21/86
[52] U.S. Cl. ................................. 250/559.4; 250/559.45; 356/237.4
[58] Field of Search ........................... 250/559.4, 559.45, 250/306–311; 356/237.4, 237.5

[56] References Cited

U.S. PATENT DOCUMENTS 5,235,400  8/1993  Terasawa et al. ..................... 356/237.5

OTHER PUBLICATIONS

KLA 1620 Emmission Microscope for Multilayer Inspection, Operation's Manual, Revision A. Software Version 2.0, Jun. 1990. (No page #).

"Near–field optical microscope break the diffraction limit," by Pat Moyer and Tim Van Slambrouck, Laser Focus World, TropMetrix, four pagee. (No date).

"IC Failure Analysis Using Real–time Emission Microscopy," by Tom Adams, Semiconductor International, two pages (No date).

"Super Resolution Imaging Spectroscopy," by T.D. Harris, R.D. Grober, J.K. Trautman, and E. Betzig, Applied Spectroscopy, vol. 48, No. 1, 1994, pp. 14A thru 21A (Month unknown).

"IC Failure Analysis: Techniques and Tools for Quality and Reliability Improvement," by Jerry M. Soden and Richard E. Anderson, Proceedings of the IEEE, vol. 81, No. 5, May 1993, pp. 703 thru 715.

*Primary Examiner*—Que T. Le
*Attorney, Agent, or Firm*—Robert D. Marshall, Jr.; Gerald E. Laws; Richard L. Donaldson

[57] ABSTRACT

An apparatus for isolating defects in an integrated circuit using near field scanning photon emission microscopy comprises a photon collector 10 which receives emitted photons 16 from a surface 14 of an energized or biased integrated circuit 12, a CCD camera 20 for converting the photons into an emission image 22, and an optical fiber 18 coupling the CCD camera 20 to the photon collector 10, so that the optical fiber transmits photons from the collector to the CCD camera. As a result, defects in integrated circuits can be isolated with greater resolution than currently available using conventional far field photon emission microscopy.

20 Claims, 2 Drawing Sheets

METHOD AND APPARATUS FOR ISOLATING DEFECTS IN AN INTEGRATED CIRCUIT NEAR FIELD SCANNING PHOTON EMISSION MICROSCOPY

This application claims priority under 35 USC 119(e) (1) of provisional application Ser. No. 60/033,101, filed Dec. 17, 1996.

TECHNICAL FIELD OF THE INVENTION

This invention relates generally to the field of integrated circuit manufacture and more particularly, to a method and apparatus for isolating defects in an integrated circuit using near field scanning photon emission microscopy.

BACKGROUND OF THE INVENTION

During the manufacture of integrated circuits, it is important to be able to detect and isolate very small defects caused by leakages, latch-ups, and other problems. Far field photon emission microscopy has been used in the past to detect photon emissions of very low energy from integrated circuits, thereby helping to isolate these types of defects. Although the sensitivity of far field photon emission microscopy is very high, its spatial resolution, being about 0.5 microns, is inadequate to detect many defects, given the fact that integrated circuits are becoming increasingly small and are already in the low sub-micron range. Thus, it is very difficult to obtain adequate resolution beyond 0.5 microns using far field photon emission microscopy.

The ability to improve resolution using far field photon emission microscopy is limited because resolution is dependent on the wavelength of the emitted light and the numerical aperture of the microscope. The resolution of far field photon emission microscopy can only be improved two ways—either by detecting shorter wavelength photons or by increasing the numerical aperture of the microscope. However, most photons emitted by integrated circuit defects have fixed wavelengths. To detect the shorter wavelengths, the integrated circuits can be coated by special materials such as rare earth chelates capable of emitting short wavelength photons, as discussed in Jerry M. Soden, et al., "IC Failure Analysis: Techniques and Tools for Quality and Reliability Improvement," Proceedings of the IEEE, Vol. 81, No. 5, May 1993, p. 707. However, this kind of material poses radiation problems and is limited in use. In addition, the numerical aperture of a camera is limited by the physical size and focal length of the lens, making it impractical and difficult to increase the numerical aperture to the desirable range.

Laser tips as a source of light have been used in the past for far field collection of light reflected off of the surface of integrated circuits, as discussed in T. D. Harris, et al., "Super-Resolution Imaging Spectroscopy," Applied Spectroscopy, Vol. 48, No. 1, January 1994, p.19A. The light path in such devices may be reversed to perform collection mode near field scanning microscopy. This technique merely collects reflected light, giving a topographical image of the sample. It does not detect defects located below the surface of the integrated circuit.

Integrated circuits have also been analyzed in the past using a multi-step process as described in KLA Instruments Corporation, San Jose, Calif., 1620 EMMI (Emission Microscope For Multilayer Inspection) Operator's Manual, Revision A, June 1990. In one step of this process, the integrated circuit is energized or biased using the proper electrical stimulus, and emitted photons are captured by a conventional lens using far field techniques. In another step, light is shined on the surface of the integrated circuit and the reflected light is captured by a camera. In the final step, the two sets of data are combined. However, the resolution available using this technology is insufficient, being only about 0.5 microns.

SUMMARY OF THE INVENTION

Therefore, a need has arisen for an improved method and apparatus for detecting and isolating defects, including sub-surface defects, in an integrated circuit, which has greater spatial resolution than that available using far field photon emission microscopy. In accordance with the present invention, an apparatus is provided that uses near field scanning photon emission optical microscopy to isolate defects in an integrated circuit, including defects located below the surface of the sample. The invention features a near field photon collector which receives photons emitted from the surface of a biased integrated circuit following application of an electrical stimulus to the circuit, a charged coupled device such as a charge coupled device camera (CCD camera) to convert the photons into an emission image, and an optical fiber coupling the CCD camera to the photon collector so that the photons are transmitted from the photon collector to the CCD camera.

In another embodiment, a method for isolating defects in an integrated circuit comprises four steps. These steps are: energizing the circuit with electrical energy, collecting photons emitted from a surface of the integrated circuit, transmitting the photons to an imaging device capable of converting the photons into an emission image, and converting the photons into an emission image. In an optional fifth step the emission image is combined with a topographical image.

A technical advantage of the present invention is that much better resolution of integrated circuit defects caused by leakages, latch-ups and other problems, including those located below the surface, can be achieved than the resolution available using conventional far field photon emission microscopy. Resolution less than or equal to 50 nanometers is possible using the present invention. Another technical advantage of the present invention is that it allows the use of a photon collector or scanning probe tip in the size of nanometers to scan very close to the specimen surface and gather data emitted from the surface due to defects, including defects below the surface. This emitted data may then be used to form an image. Thus, the spatial resolution of the present invention is much greater than far field photon emission microscopy, as it is limited only by the dimension of the tip, which can be in tens of nanometers or smaller. Another technical advantage of the present invention is that in integrated circuit applications, one can get more detail by using the present invention to observe metal to metal shorts, to view the details of hot electrons penetrating a gate oxide, to observe photons generated by shorts such as a Vcc to Vss short in an integrated circuit, and to isolate other defects such as P-N junction leakages, latch-ups, process and/or structure induced failures, saturated transistors, substrate related failures, junction spiking, electrostatic discharge damages, hot electron effects, oxide defects, impact ionization, junction breakdown, gate pinholes and current leakages. Another technical advantage of the present invention is that the emission image can be saved and overlapped with a topographical image obtained using conventional collection mode near field scanning optical microscopy, in order to better pinpoint the emission site or defect.

BRIEF DESCRIPTION OF THE DRAWINGS

For a more complete understanding of the present invention, the objects and advantages thereof, references now made to the following descriptions taken in connection with the accompanying drawings in which.

DETAILED DESCRIPTION OF THE INVENTION

Preferred embodiments of the present invention and its advantages are best understood by referring to FIGS. 1 through 4 of the drawings, like numerals being used for like in corresponding parts of the various drawings.

Figure 1:
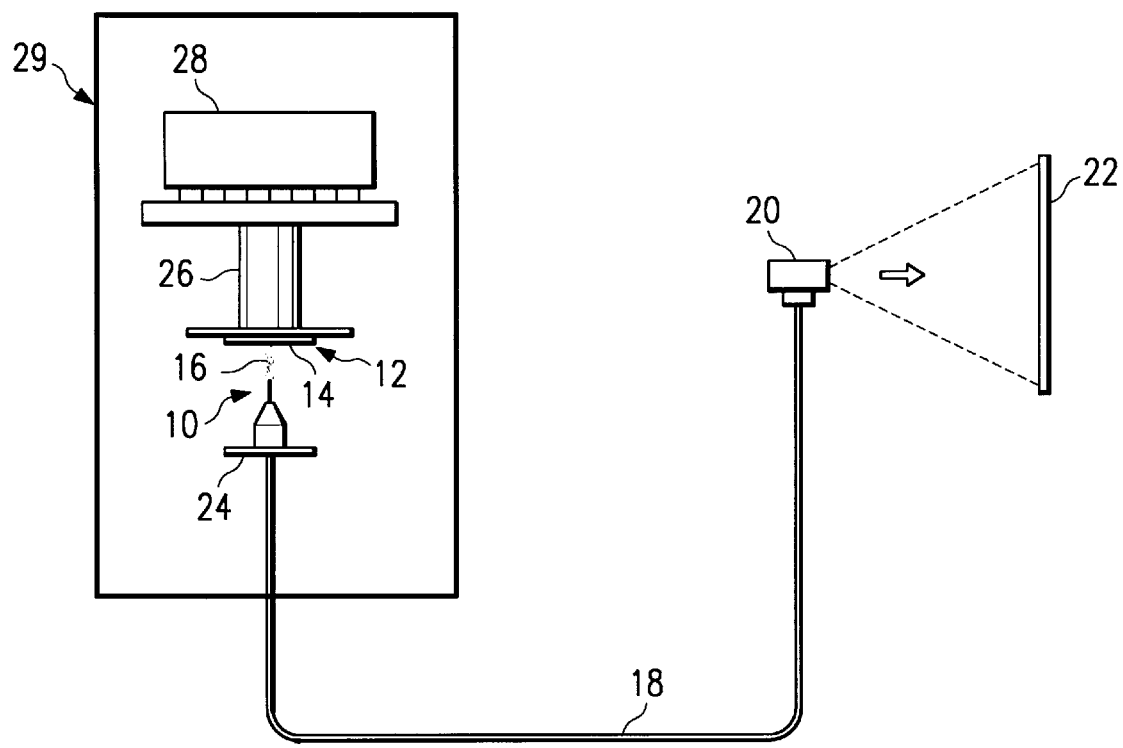
FIG. 1 is a schematic of a preferred embodiment of the present invention, depicting the use of near field scanning photon emission microscopy.

FIG. 1 is a schematic of a preferred embodiment of the present invention. The apparatus comprises a photon collector 10, such as a laser tip or scanning probe tip available from TopoMetrix of Santa Clara, Calif., or any other device capable of collecting photons. Scanning probe tips currently available, such as those available from TopoMetrix, may be as small as 0.05 microns in diameter. The photon collector 10 is used to scan an integrated circuit 12, and more particularly, a surface 14 of the integrated circuit being evaluated. Alternatively, the present invention could be used to evaluate any kind of semiconductor device.

Photon collector 10 picks up photons 16 emitted from surface 14 of biased integrated circuit 12. These photons are emitted from defects or biased transistors in the circuit, including subsurface defects, when an appropriate electrical stimulus is supplied to the circuit. Subsurface defects can be detected because silicon and silicon-related substances, such as those used in passivation layers, are transparent to the emitted photons. Defects capable of detection include, but are not limited to, shorts, P-N junction leakages, latch-ups and process and/or structure induced failures, saturated transistors, substrate related failures, junction spiking, electrostatic discharge damages, hot electron effects, oxide defects, impact ionization, junction breakdown, gate pinholes and current leakages. The electrical stimulus may be applied to the circuit using any conventional means.

Photon collector 10 is coupled to an optical fiber 18. Optical fiber 18 is used to transmit the emitted photons from the photon collector to a CCD camera 20 using fiber optics. Suitable optical fibers are available from 3M; however, any optical fiber having a good band width in the 500 to 1100 nanometer range may be used. Suitable CCD cameras include Model CH 270 from Photomatrics of Tucson, Ariz. In an alternative embodiment, the photons may be transferred to any CCD device for conversion into usable data.

The CCD camera 20 converts the transmitted photons into emission images 22. These images provide information as to the presence and location of many kinds of defects, such as those caused by leakages, latch-ups, and other problems in the integrated circuit. Photon collector 10 may be mounted on a platform 24 which may be moved perpendicular to or vertically with respect to surface 14 of the integrated circuit 12 being tested. As depicted in FIG. 1, the sample or integrated circuit being tested may be mounted on an end of a piezoelectric scan tube 26. The piezoelectric scan tube 26 may be capable of motion in all three axes, x, y and z, where x and y are the axes lying in a plane parallel to the surface of the integrated circuit, and z is the axis perpendicular to the x/y plane, or vertical with respect to horizontal surface 14. Piezoelectric scan tubes suitable for use in the present invention are commercially available from a number of commercial sources, including Digital Instruments of Santa Barbara, Calif., or TopoMetrix of Santa Clara, Calif. In a preferred embodiment, piezoelectric scan tube 26 moves the integrated circuit so that the photon collector 10 scans surface 14 of integrated circuit 12 in raster fashion.

As further depicted in FIG. 1, the piezoelectric scan tube 26 may be attached to a translation stage 28. In a preferred embodiment, the translation stage is fixed. Photon collector 10, integrated circuit 12, piezoelectric scan tube 26, and translation stage 28 are housed or enclosed in dark box 29 or any other container known in the art which is impervious to light.

Figure 2:
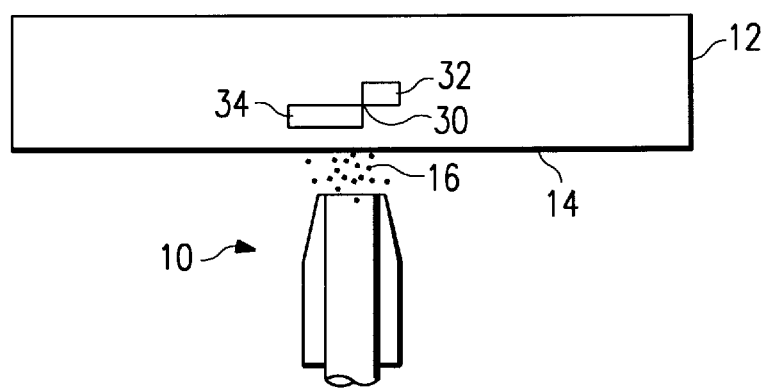
FIG. 2 is a block diagram showing a photon collector picking up photons generated by a Vcc to Vss short in an integrated circuit.

As depicted in FIG. 2, showing a block diagram of a photon collector being used to collect photons from a Vcc to Vss short, photon collector 10 may have very minute dimensions, i.e., 0.05 microns in diameter, and be placed in very close proximity to surface 14 of integrated circuit 12. Thus, the photon collector is able to pick up photons generated by such defects as a short 30 between a Vss 32 and a Vcc 34.

In operation, the sample or integrated circuit 12, mounted on piezoelectric scan tube 26, is biased or energized using an appropriate electrical stimulus. The piezoelectric scan tube 26 moves the integrated circuit 12 in raster or other fashion allowing the surface 14 to be scanned by photon collector 10. Defects in the integrated circuit will cause photons 16 to be emitted that are then picked up by photon collector 10. The photon collector then transmits the photons via optical fiber 18 to the CCD camera 20. The CCD camera 20 then creates an emission image 22, which isolates the defects in the circuit. The integrated circuit may also be rotated so that the reverse or backside surface can be analyzed or scanned.

In another embodiment of the present invention, the position of the sample may be fixed, and the position of the photon collector varied with respect to the sample to allow scanning to occur.

Figure 3:
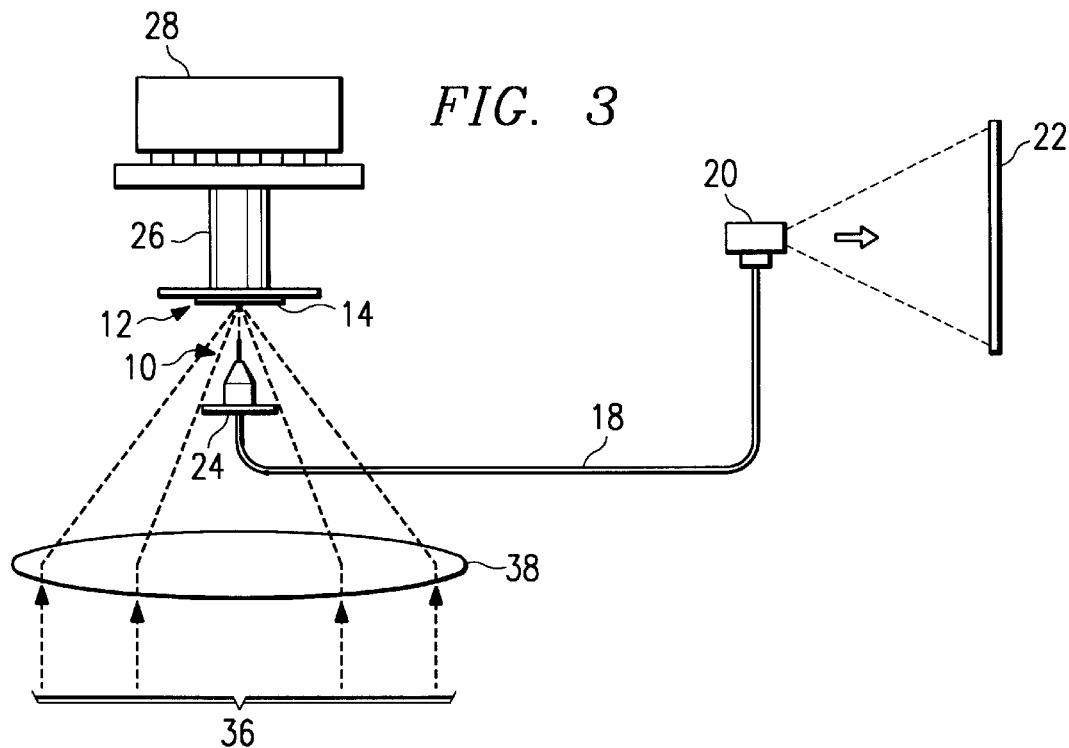
FIG. 3 is a schematic of a preferred embodiment of the present invention, depicting the use of near field scanning photon emission microscopy in connection with collection mode near field scanning optical microscopy.

As depicted in FIG. 3, the present invention can be used in conjunction with known reflective imaging techniques, in which a reference optical image of surface 14 is obtained by shining light 36 on surface 14 of the integrated circuit 12 and capturing the reflected light. Specifically, after the emission image 22 has been captured and saved in a computer, the topography of integrated circuit 12 can be captured using collection mode near field scanning optical microscopy. As shown in FIG. 3, light 36 is focused on surface 14 of integrated circuit 12 using microscopic objective 38, and the reflected light is picked by photon collector 10 and sent to CCD camera 20. The saved emission image 22 can then be overlapped in the computer with the topographical image or data to better pinpoint or locate the coordinates of the defect or emission site. Alternatively, the topographical image can be captured before obtaining the emission image.

Figure 4:
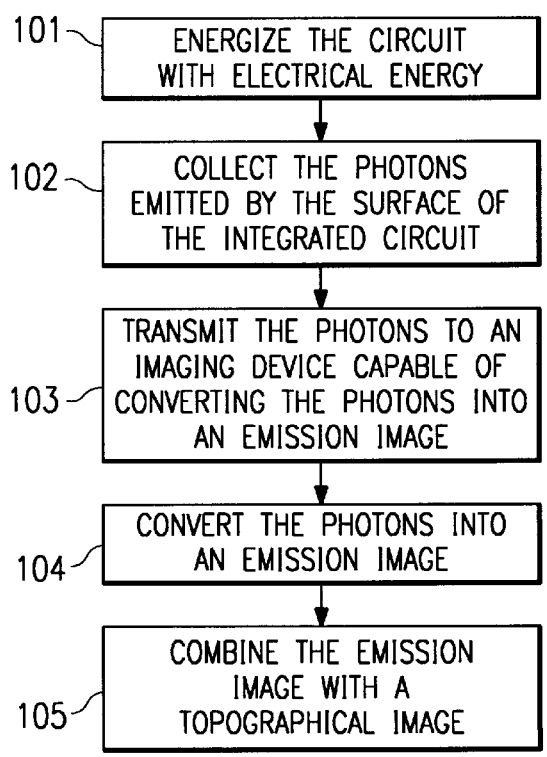
FIG. 4 illustrates a preferred method of the present invention.

The present invention also relates to a method of isolating defects in an integrated circuit. Referring now to FIG. 4, the preferred method of the present invention is illustrated. In step 101, an integrated circuit is energized or biased by the application of appropriate electrical stimulus. This causes defects in the circuit to emit photons. In step 102, the emitted photons are collected from a surface of the integrated circuit using a photon collector such as a scanning probe tip. In step 103, the photons are transmitted to an imaging device such as a CCD camera using an optical fiber (preferably with a good band width in the 500 to 1100 nanometer range) coupled to the photon collector and CCD camera. In Step 104, the photons are converted into an emission image using the CCD camera. The photon collector may be mounted on a platform that can be moved perpendicular to or vertically with respect to the horizontal surface of the sample being evaluated. The integrated circuit being evaluated may be mounted on a piezoelectric scan tube which is capable of movement in all three axes, x, y and z, where the x and y axes lie in a plane parallel to the surface of the integrated circuit being tested and the z axis is perpendicular to the x/y plane. The piezoelectric scan tube may vary the position of the integrated circuit with respect to the photon collector so that the circuit may be scanned in raster or other fashion. The piezoelectric scan tube may be mounted on a translation stage. Preferably, the integrated circuit, photon collector, piezoelectric scan tube and translation stage may be housed or enclosed in a dark box or other container impervious to light.

In an optional further step 105, the emission image is combined or overlapped with a topographical image or data which is obtained using collection mode near field scanning optical microscopy, in order to better pinpoint the emission site.

As can be seen from the foregoing, the apparatus and method of the present invention can be used to detect and isolate minute defects in an integrated circuit or any kind of semiconductor device. The present invention is capable of much higher resolution than that available through conventional far field photon emission microscopy and can detect photons generated from sub-surface defects.

While the invention has been particularly shown and described by the foregoing detailed description, it will be understood by those skilled in the art that various other changes in the form and detail may be made without departing from the spirit and scope of the invention.

What is claimed is:

1. An apparatus for isolating defects in an integrated circuit comprising:
   a. A means for applying an electrical stimulus to energize the integrated circuit thereby causing photons emitted from the defects
   b. A near field photon collector for receiving emitted photons from a near field of the surface of the integrated circuit;
   c. A charge coupled device for converting the photons into an emission image; and
   d. An optical fiber coupling the charged coupled device to the photon collector, so that the optical fiber transmits the photons received by the photon collector to the charge coupled device.

2. The apparatus of claim 1, wherein the integrated circuit is biased.

3. The apparatus of claim 2, wherein the charge coupled device comprises a charge coupled device camera.

4. The apparatus of claim 2, wherein the photon collector comprises a scanning probe tip.

5. The apparatus of claim 2, further comprising a platform which is movable along an axis perpendicular to the surface of the integrated circuit, the photon collector being mounted on the platform.

6. The apparatus of claim 5, further comprising a piezoelectric scan tube upon which the integrated circuit is mounted, the piezoelectric scan tube being capable of movement in a plane parallel to the surface of the integrated circuit and being capable of movement along an axis perpendicular to the surface of the integrated circuit.

7. The apparatus of claim 6, wherein the piezoelectric scan tube moves the integrated circuit in raster fashion so that the photon collector can scan the surface of the integrated circuit.

8. The apparatus of claim 6, further comprising a translation stage to which the piezoelectric scan tube is attached and a dark box which houses the integrated circuit and photon collector.

9. A method for isolating defects in an integrated circuit, comprising:
   a. Energizing the integrated circuit with an electrical stimulus thereby causing photons emitted from the defects;
   b. collecting photons emitted from a near field of the surface of the integrated circuit;
   c. transmitting the photons to an imaging device capable of converting the photons into an emission image; and
   d. converting the photons into an emission image.

10. The method of claim 9, wherein a photon collector is used for collecting the emitted photons.

11. The method of claim 10, wherein the photon collector comprises a scanning probe tip.

12. The method of claim 10, wherein the step of collecting the photons comprises scanning the integrated circuit by mounting the integrated circuit on a piezoelectric scan tube and using the piezoelectric scan tube to vary the position of the integrated circuit with respect to the photon collector.

13. The method of claim 12, wherein the integrated circuit is scanned in raster fashion.

14. The method of claim 9, wherein the imaging device comprises a charge coupled device.

15. The method of claim 14, wherein an optical fiber is used to transmit the photons from the photon collector to the charge coupled device.

16. The method of claim 9, further comprising the step of combining the emission image with a topographical image.

17. A method for isolating defects in a semiconductor, comprising:
   a. Energizing the semiconductor with an electrical stimulus thereby causing photons emitted from the defects;
   b. collecting photons emitted from a near field of the surface of the semiconductor;
   c. transmitting the photons to an imaging device capable of converting the photons into an emission image; and
   d. converting the photons into an emission image.

18. The method of claim 17, wherein a photon collector is used for collecting the emitted photons.

19. The method of claim 17, wherein the imaging device comprises a charge coupled device.

20. The method of claim 17, wherein an optical fiber is used to transmit the photons from the photon collector to the charge coupled device.

* * * * *